United States Patent
Zhang (10) Patent No.: US 12,218,208 B2
(45) Date of Patent: Feb. 4, 2025

(54) DISPLAY PANEL, DISPLAY PANEL MANUFACTURING METHOD, AND DISPLAY DEVICE

(71) Applicant: HKC CORPORATION LIMITED, Shenzhen (CN)

(72) Inventor: Hejing Zhang, Chongqing (CN)

(73) Assignee: HKC CORPORATION LIMITED, Shenzhen (CN)

( * ) Notice: Subject to any disclaimer, the term of this patent is extended or adjusted under 35 U.S.C. 154(b) by 737 days.

(21) Appl. No.: 17/298,605

(22) PCT Filed: Dec. 6, 2019

(86) PCT No.: PCT/CN2019/123580
§ 371 (c)(1),
(2) Date: May 31, 2021

(87) PCT Pub. No.: WO2020/134957
PCT Pub. Date: Jul. 2, 2020

(65) Prior Publication Data
US 2022/0028986 A1 Jan. 27, 2022

(30) Foreign Application Priority Data
Dec. 24, 2018 (CN) .......................... 201811582279.3

(51) Int. Cl.
*H01L 29/417* (2006.01)
*H01L 29/40* (2006.01)
(Continued)

(52) U.S. Cl.
CPC ...... *H01L 29/41733* (2013.01); *H01L 29/401* (2013.01); *H01L 27/1244* (2013.01); *H01L 27/1259* (2013.01); *H01L 29/7869* (2013.01)

(58) Field of Classification Search
CPC ............. H10K 50/844; H10K 50/8445; H10K 59/1213; H10K 59/124; H10K 59/131;
(Continued)

(56) References Cited

U.S. PATENT DOCUMENTS

2011/0248345 A1 10/2011 Sasagawa
2013/0087784 A1* 4/2013 Honda .............. H01L 29/66969
257/43
(Continued)

FOREIGN PATENT DOCUMENTS

CN 104218094 A 12/2014
CN 104362125 A 2/2015
(Continued)

OTHER PUBLICATIONS

Xuelian Liu, the ISA written comments, Mar. 2020, CN.
Xuelian Liu, the International Search Report, Mar. 2020, CN.

*Primary Examiner* — Brook Kebede (57) ABSTRACT

The present application discloses a display panel, a display panel manufacturing method, and a display device. The display panel includes a source region and a drain region. A dielectric layer covering the source region and the drain region is provided with a first via hole and a second via hole separately. The first via hole is connected to the source region or the drain region, the second via hole is located on the top of the first via hole and is in communication with the first via hole, and an aperture of the second via hole is larger than an aperture of the first via hole.

8 Claims, 10 Drawing Sheets

(51) Int. Cl.
*H01L 27/12* (2006.01)
*H01L 29/786* (2006.01)

(58) Field of Classification Search
CPC ............ H01L 23/485; H01L 23/53295; H01L 27/1225; H01L 27/124; H01L 27/1244; H01L 27/1248; H01L 27/1251; H01L 27/1259; H01L 29/401; H01L 29/41733; H01L 29/786; H01L 29/78666; H01L 29/78675; H01L 29/7869; G02F 1/1368
See application file for complete search history.

(56) References Cited

U.S. PATENT DOCUMENTS

| | | | |
|---|---|---|---|
| 2017/0104046 A1 | 4/2017 | Seo et al. | |
| 2017/0271376 A1* | 9/2017 | Murai | H01L 27/1248 |
| 2017/0287946 A1* | 10/2017 | Hiromasu | H01L 27/1218 |
| 2018/0076238 A1* | 3/2018 | Lim | H01L 27/1251 |

FOREIGN PATENT DOCUMENTS

| | | | |
|---|---|---|---|
| CN | 104952934 A | 9/2015 | |
| CN | 105552035 A | 5/2016 | |
| CN | 105633094 A | 6/2016 | |
| CN | 105826397 A | 8/2016 | |
| CN | 106847744 A | 6/2017 | |
| CN | 107204373 A | 9/2017 | |
| CN | 107331669 A | 11/2017 | |
| CN | 107611085 A | 1/2018 | |
| CN | 107833893 A | 3/2018 | |
| CN | 108490707 A | 9/2018 | |
| CN | 109755260 A | 5/2019 | |
| JP | 2015167261 A | 9/2015 | |

\* cited by examiner

Forming a photoresist layer on the dielectric layer, and performing first-time etching to form a photoresist hole, and via holes connected to the source region and the drain region, respectively — S101

Ashing the photoresist layer to make an aperture of the photoresist hole larger than the aperture of the via hole — S102

Performing second-time etching on the dielectric layer based on an aperture of the photoresist hole, to form the first via hole and the second via hole, where a depth of the etching is less than a thickness of the dielectric layer — S103

```
Removing the photoresist layer through ashing treatment    — S141

Depositing metal in the via hole to form a drain and a
source, where a surface of the source region and a surface of
the drain region are conductive, the source and the drain are
electrically connected to the source region and the drain     — S142
region through the via hole respectively, and a passivation
layer is formed on the source, the drain, and the dielectric
layer
```

110 Display device

120 Display panel

FIG. 19

DISPLAY PANEL, DISPLAY PANEL MANUFACTURING METHOD, AND DISPLAY DEVICE

CROSS-REFERENCE TO RELATED APPLICATIONS

The present application claims priority to the Chinese Patent Application No. CN201811582279.3, filed with the China National Intellectual Property Administration on Dec. 24, 2018 and entitled "DISPLAY PANEL, DISPLAY PANEL MANUFACTURING METHOD, AND DISPLAY DEVICE", which is incorporated herein by reference in its entirety.

TECHNICAL FIELD

The present application relates to the field of display technologies, and in particular, to a display panel, a display panel manufacturing method, and a display device.

BACKGROUND

The statements herein only provide background information related to the present application, and do not necessarily constitute related art.

In the field of display technologies, flat panel display devices are widely used in various consumer electronic products such as mobile phones, televisions, personal digital assistants, digital cameras, notebook computers, and desktop computers due to their advantages of high image quality, power saving, thin body, wide application range, etc., and have become mainstream display devices. A thin film transistor (TFT) is a main driving element in a liquid crystal display (LCD) and an active matrix organic light emitting diode (AMOLED), and is directly related to a development direction of high-performance flat panel display devices.

In a process of manufacturing a thin film transistor with a bottom gate structure, metal wires are prone to poor contact or even break when they are bonded with a semiconductor layer.

SUMMARY

The objective of the present application is to provide a display panel, a display panel manufacturing method, and a display device.

The present application discloses a display panel. The display panel includes: a substrate; a buffer layer formed on the substrate; a semiconductor layer formed on the buffer layer, where the semiconductor layer includes a source region, a drain region, and a channel region, and the channel region is arranged between the source region and the drain region; a gate insulating layer formed at a position corresponding to the channel region of the semiconductor layer; a gate metal layer formed on the gate insulating layer; and a dielectric layer, separately covering the buffer layer, the semiconductor layer, and the gate metal layer, where the dielectric layer correspondingly covering the source region and the drain region is provided with via holes separately, the via holes include a first via hole and a second via hole, the first via hole is connected to the source region or the drain region, the second via hole is located on the top of the first via hole and is in communication with the first via hole, and an aperture of the second via hole is larger than an aperture of the first via hole.

The present application further discloses a display panel manufacturing method, including the following steps:
providing a substrate and forming a buffer layer on the substrate;
forming a semiconductor layer on the buffer layer, where the semiconductor layer includes a source region, a drain region, and a channel region, and the channel region is arranged between the source region and the drain region;
forming a gate insulating layer at a position corresponding to the channel region on the semiconductor layer, and forming a gate metal layer on the gate insulating layer;
depositing a dielectric layer on a surface of the gate metal layer, a surface of the semiconductor layer, and a surface of the buffer layer; and
forming via holes respectively corresponding to the source region and the drain region on the dielectric layer, where the via holes include a first via hole and a second via hole, the first via hole is connected to the source region or the drain region, the second via hole is located on the top of the first via hole and is in communication with the first via hole, and an aperture of the second via hole is larger than an aperture of the first via hole.

The present application further discloses a display device, including the above-mentioned display panel.

In comparison with a solution of etching a via hole with an identical aperture on the dielectric layer, in the disclosure, the dielectric layer is etched to form a first via hole and a second via hole that are in communication with each other; the second via hole is located on the top of the first via hole; an aperture of the second via hole is larger than an aperture of the first via hole. When metal wires are bonded, a buffer structure is formed, so that steepness of the via hole is reduced and the metal wires are not easy to break.

BRIEF DESCRIPTION OF DRAWINGS

The included drawings are intended to provide a further understanding of one or more embodiments of the present application, which constitute a part of the specification. The drawings are used to illustrate the implementations of the present application, and together with the text description, explain the principle of the present application. Clearly, the drawings in the following description are merely some embodiments of the present application. A person of ordinary skill in the art can derive other drawings from these drawings without creative efforts. In the drawings.

DETAILED DESCRIPTION OF EMBODIMENTS

It should be understood that the used terms, and the disclosed specific structures and functional details herein are merely for describing one or more specific embodiments and are representative. However, the present application can be specifically implemented in many alternative forms, and should not be interpreted to be limited to one or more embodiments described herein.

The terms "first" and "second" in the description of the present application are merely intended for a purpose of description, and should not be understood as an indication of relative importance or an implicit indication of a quantity of indicated technical features. Hence, unless otherwise stated, the features defined by "first" and "second" can explicitly or implicitly include one or more features; and "a plurality of" means two or more. The term "include" and any variations thereof are intended to cover a non-exclusive inclusion, and there may be the presence or addition of one or more other features, integers, steps, operations, elements, components and/or combinations thereof.

In addition, the orientation or position relationships indicated by the terms "center" "transversal", "upper", "lower", "left", "right", "vertical", "horizontal", "top", "bottom" "inner", "outer", etc. are based on the orientation or position relationships shown in the drawings, for ease of the description of the present application and simplifying the description only, rather than indicating that the indicated device or element must have a particular orientation or be constructed and operated in a particular orientation. Therefore, these terms should not be understood as a limitation on the present application.

In addition, unless otherwise specified and defined, the terms "install", "connected with", and "connected to" should be comprehended in a broad sense. For example, these terms may be comprehended as being fixedly connected, detachably connected or integrally connected; mechanically or electrically connected; or directly connected or indirectly connected through an intermediate medium, or in internal communication between two elements. The specific meanings about the foregoing terms in the present application may be understood by a person of ordinary skill in the art depending on specific circumstances.

An active organic light emitting diode display includes an active array substrate and an organic light emitting diode layer. The array substrate includes one or more thin film transistors. With people's increasing highly demands for resolution and display quality of display panels, high-resolution display panels and active organic light emitting diode displays usually use the form of top-gate thin film transistors, because parasitic capacitance of commonly used bottom gate thin film transistors is relatively lame, which is not conducive to high resolution and organic light emitting diode display.

The following further describes the present application with reference to drawings and one or more optional embodiments.

Figure 1:
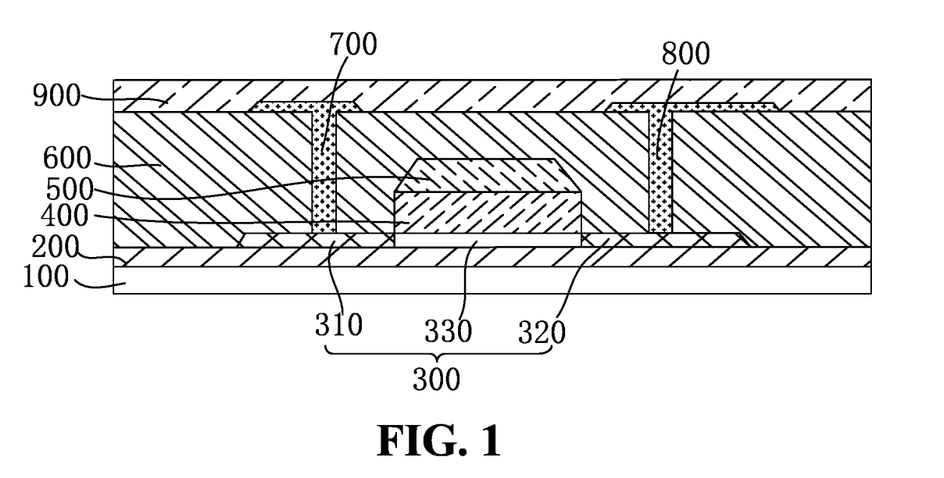
FIG. 1 is a schematic diagram of an example thin film transistor with a single-hole top gate structure.
Figure 2:
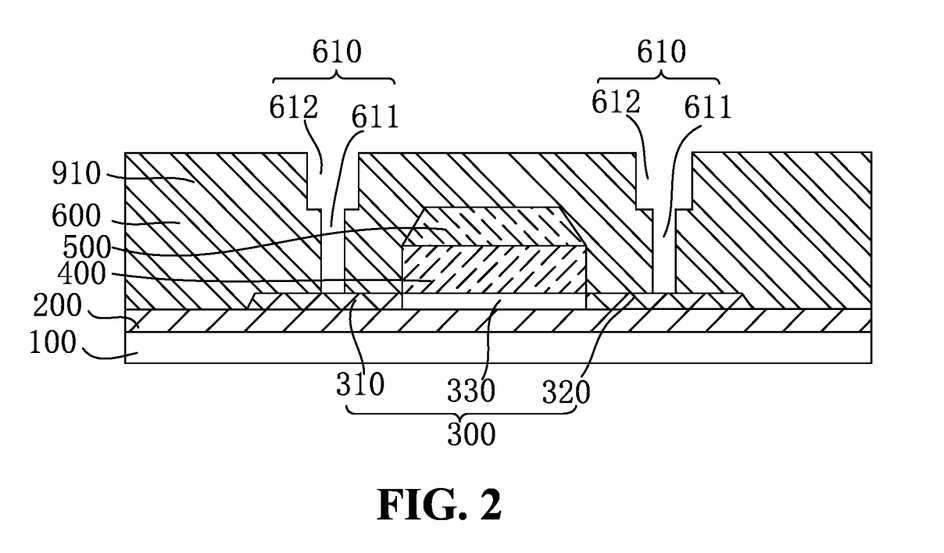
FIG. 2 is a schematic diagram of a display panel according to one or more embodiments of the disclosure.

As shown in FIG. 1, the inventor uses an undisclosed example display panel structure.

The display panel 120 includes: a substrate 100; a buffer layer 200 formed on the substrate 100; a semiconductor layer 300 formed on the buffer layer 200, where the semiconductor layer 300 includes a source region 310, a drain region 320, and a channel region 330, and the channel region 330 is arranged between the source region 310 and the drain region 320; a gate insulating layer 400 formed at a position corresponding to the channel region 330 of the semiconductor layer 300; a gate metal layer 500 formed on the gate insulating layer 400; and a dielectric layer 600, separately covering the buffer layer 200, the semiconductor layer 300, and the gate metal layer 500, where a source 700 and a drain 800 are formed on the dielectric layer 600, the source 700 and the drain 800 are respectively connected to the source region 310 and the drain region 320 through a single via hole, and then the dielectric layer 600, the source 700, and the drain 800 are covered by a passivation layer 900.

As shown in FIG. 2 to FIG. 4 and FIG. 19, one or more embodiments disclose a display panel 120. The display panel 120 includes: a substrate 100; a buffer layer 200 formed on the substrate 100; a semiconductor layer 300 formed on the buffer layer 200, where the semiconductor layer 300 includes a source region 310, a drain region 320, and a channel region 330, and the channel region 330 is arranged between the source region 310 and the drain region 320; a gate insulating layer 400 formed at a position corresponding to the channel region 330 of the semiconductor layer 300; a gate metal layer 500 formed on the gate insulating layer 400; and a dielectric layer 600, separately covering the buffer layer 200, the semiconductor layer 300, and the gate metal layer 500, where the dielectric layer 600 correspondingly covering the source region 310 and the drain region 320 is provided with via holes 610 separately, the via holes 610 include a first via hole 611 and a second via hole 612, the first via hole 611 is connected to the source region 310 or the drain region 320, the second via hole 612 is located on the top of the first via hole 611 and is in communication with the first via hole 611, and an aperture of the second via hole 612 is larger than an aperture of the first via hole 611.

In comparison with the example technical solution shown in FIG. 1, in a process of manufacturing a top-gate thin film transistor, to achieve better characteristics of the thin film transistor, a thickness of the dielectric layer 600 (In-Layer Dielectric, ILD) is usually large (≥4000 A). After the dielectric layer 600 is etched, the via hole 610 is deep, and the deep and steep via hole 610 may cause metal wires to be prone to poor contact or even break when they are bonded with the semiconductor layer 300, reducing product quality and yield. In the disclosure, the dielectric layer 600 is etched to form a first via hole 611 and a second via hole 612 that are in communication with each other; the second via hole 612 is located on the top of the first via hole 611; an aperture of the second via hole 612 is larger than an aperture of the first via hole 611. When metal wires are bonded, a buffer structure is formed, so that steepness of the via holes 610 is reduced, and a phenomenon of poor contact or even break when the metal wires are bonded with the semiconductor layer 300 is alleviated.

Specifically, during etching, the first via hole 611 and the second via hole 612 are etched along an identical axis, and the first via hole 611 and the second via hole 612 are coaxial. After the etching is completed, when metal wires are deposited in the first via hole 611 and the second via hole 612, it can be ensured that the metal wires evenly cover sidewalls of the first via hole 611 and the second via hole 612, so that the metal wires have an identical thickness and are not easy to break.

Figure 3:
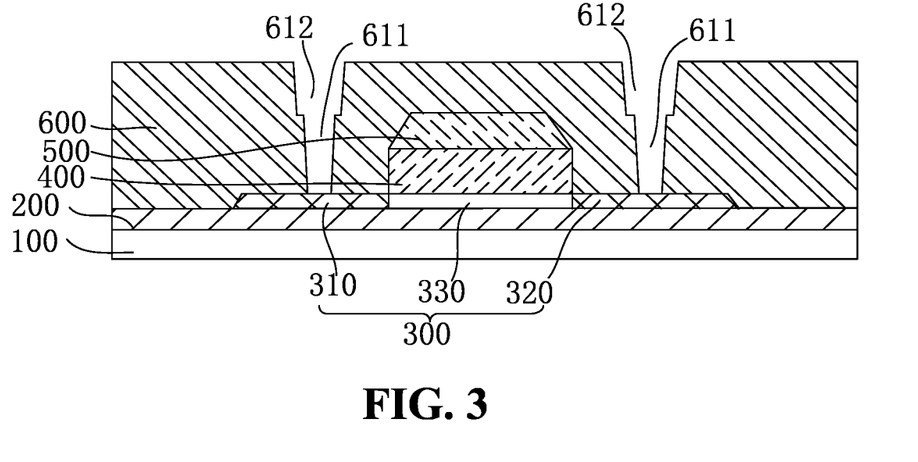
FIG. 3 is a schematic diagram of a display panel according to one or more embodiments of the disclosure.

More specifically, during etching, the first via hole 611 and the second via hole 612 are etched into cylindrical holes. The first via hole 611 and the second via hole 612 are cylindrical holes, the sidewalk of which are all perpendicular to the horizontal line, which are relatively easy to operate and implement during etching. Certainly, the first via hole 611 and the second via hole 612 may alternatively have other shapes. As shown in FIG. 3, the aperture of the first via hole 611 gradually increases from the source region 310 or the drain region 320 to the top of the first via hole 611. The aperture of the second via hole 612 gradually increases from the top of the first via hole 611 to the top of the second via hole 612. The etched first via hole 611 and second via hole 612 are similar in shape to a cone, and their sidewalls are sloped, and their apertures gradually increase from bottom to top. When metal wires are deposited in the holes, steepness of the metal wires can be reduced, and a coverage thickness of the metal wires further increases, so that the metal wires are not easy to break.

In addition, a depth of the etching is also related to the deposited metal wires. During etching, a depth of the first via hole 611 and a depth of the second via hole 612 are identical. When metal wires are deposited, the deposition is more uniform and stress is shared. Certainly, to make the steepness of the metal wires better, the depth of the first via hole 611 should be greater than the depth of the second via hole 612. The first via hole 611 is located below the second via hole 612, and the metal wires deposited in the first via hole 611 are subjected to greater pressure, making the metal wires adhere to the sidewall so that adhesion is better and the metal wires are not easy to break.

Figure 4:
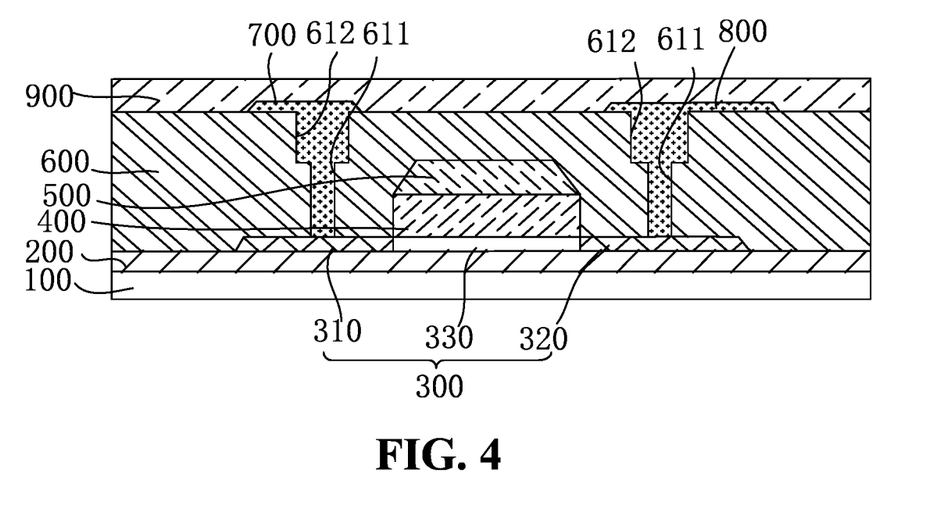
FIG. 4 is a schematic diagram of a display panel according to one or more embodiments of the disclosure.
Figure 5:
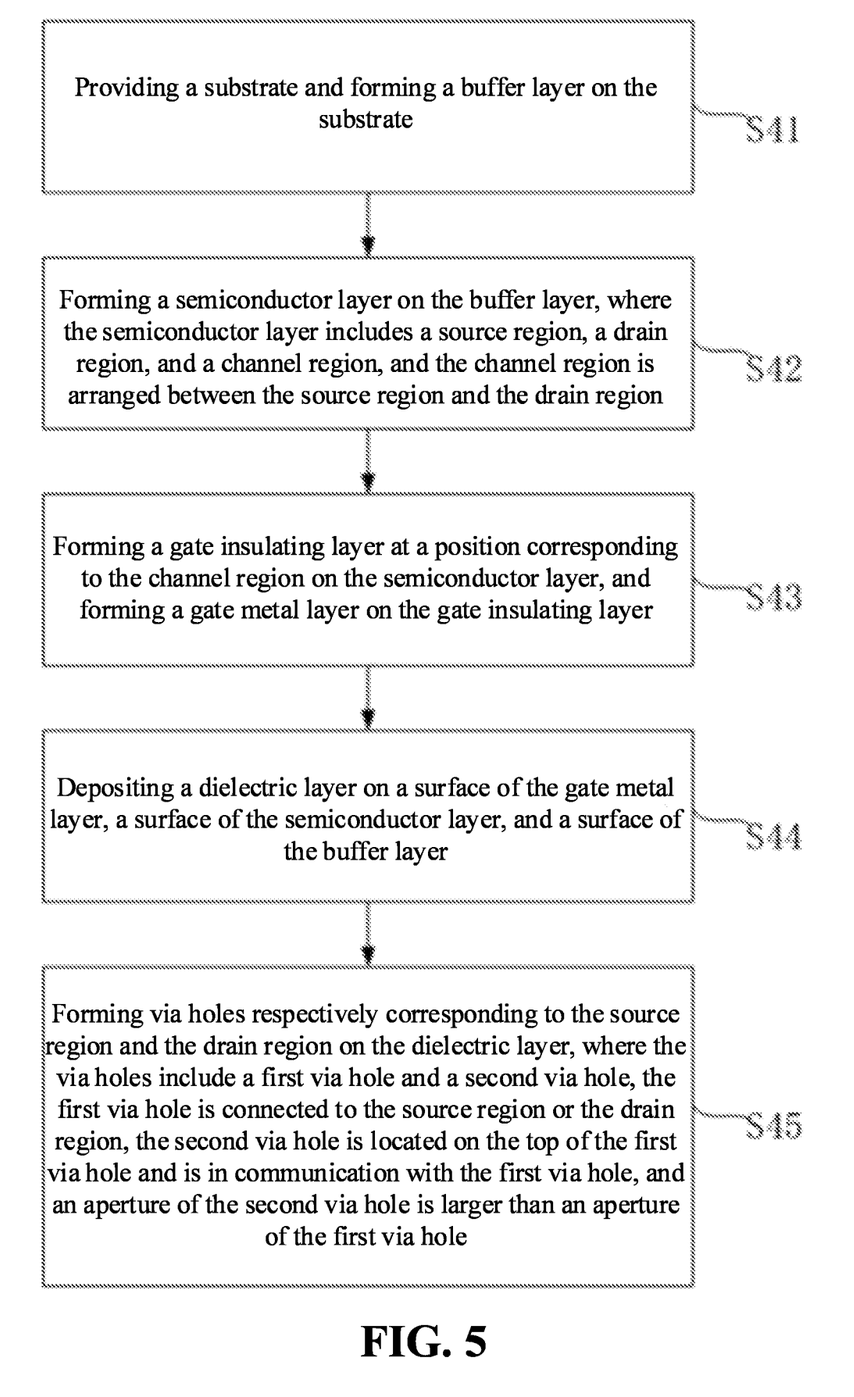
FIG. 5 is a schematic diagram of steps of a display panel manufacturing method according to one or more embodiments of the disclosure.

After the metal wires are deposited, a subsequent process is required. As shown in FIG. 4, metal is deposited in the hole to form a drain 800 and a source 700. A surface of the source region 310 and a surface of the drain region 320 are conductive, and the source 700 and the drain 800 are electrically connected to the source region 310 and the drain region 320 through the via hole 610, respectively. The display panel 120 further includes a passivation layer 900, which covers the source 700, the drain 800, and the dielectric layer 600. Metal is deposited in the via hole 610 to form the source 700 and the drain 800, which are electrically connected to the source region 310 and the drain region 320, respectively, to achieve a conductive effect.

As shown in FIG. 5 to FIG. 19, in one or more embodiments of the disclosure, a method for manufacturing a display panel 120 is disclosed, including the following steps:

S41: Provide a substrate 100 and form a buffer layer 200 on the substrate 100.

S42: Form a semiconductor layer 300 on the buffer layer 200, where the semiconductor layer 300 includes a source region 310, a drain region 320, and a channel region 330, and the channel region 330 is arranged between the source region 310 and the drain region 320.

S43: Form a gate insulating layer 400 at a position corresponding to the channel region 330 on the semiconductor layer 300, and form a gate metal layer 500 on the gate insulating layer 400.

S44: Deposit a dielectric layer 600 on a surface of the gate metal layer 500, a surface of the semiconductor layer 300, and a surface of the buffer layer 200.

S45: Form via holes 610 respectively corresponding to the source region 310 and the drain region 320 on the dielectric layer 600, where the via holes 610 include a first via hole 611 and a second via hole 612, the first via hole 611 is connected to the source region 310 or the drain region 320, the second via hole 612 is located on the top of the first via hole 611 and is in communication with the first via hole 611, and an aperture of the second via hole 612 is larger than an aperture of the first via hole 611.

Figure 6:
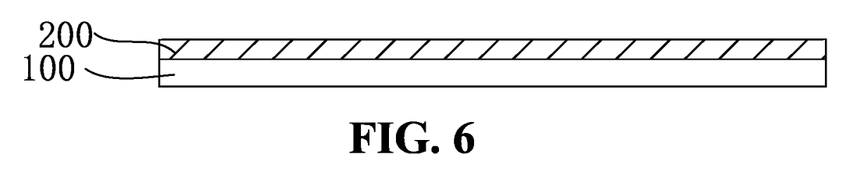
FIG. 6 to FIG. 10 are schematic flowcharts of a display panel manufacturing method according to one or more embodiments of the disclosure.

As shown in FIG. 6 and step S41, the substrate 100 is provided. The substrate 100 may be a glass substrate, a quartz substrate, a stainless steel substrate, or a plastic substrate. The buffer layer 200 is formed on the substrate 100, including forming the buffer layer 200 through physical vapor deposition (PVD), chemical vapor deposition (CVD), or plasma enhanced chemical vapor deposition (PECVD). The buffer layer 200 can be selectively arranged on the substrate 100 based on actual needs to prevent impurities in the substrate 100 from diffusing into a subsequently formed material layer in the manufacturing process. The buffer layer 200 is, for example, a single-layer or multi-layer structure of material layers such as a silicon oxide layer, a silicon nitride layer, and a silicon oxynitride layer. This is not limited in the disclosure.

Figure 7:
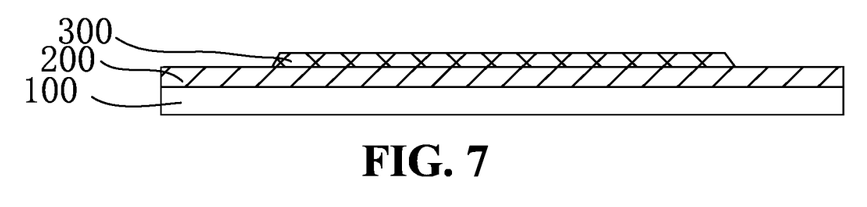

As shown in FIG. 7 and step S42, the semiconductor layer 300 is formed on the buffer layer 200, and the semiconductor layer 300 is formed by deposition of at least one of a zinc oxide based semiconductor material, an indium oxide based semiconductor material, a tin oxide based semiconductor material, and another semiconductor material.

Figure 8:
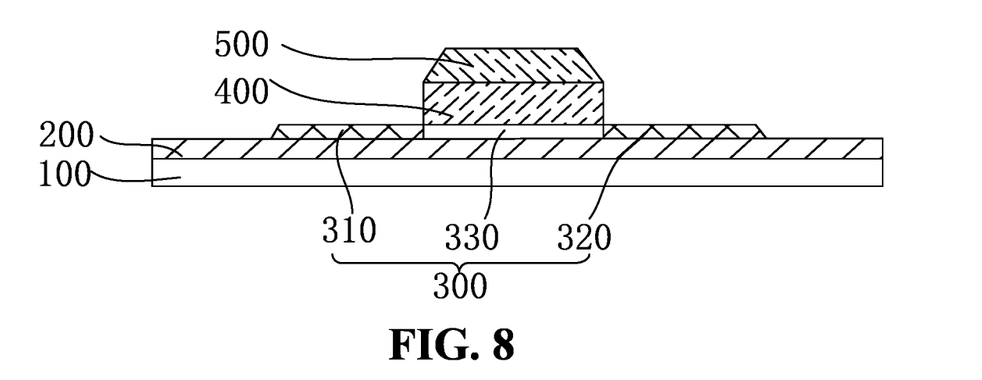

As shown in FIG. 8 and step S43, the semiconductor layer 300 includes the source region 310, the drain region 320, and the channel region 330. The gate insulating layer 400 is formed at a position corresponding to the channel region 330 of the semiconductor layer 300. In this step, the gate insulating layer 400 can be formed through deposition, which is formed by deposition of insulating materials such as silicon oxide and silicon nitride, and the gate metal layer 500 is formed on the gate insulating layer 400 by using at least one of aluminum, molybdenum, copper, silver, and another metal material.

Figure 9:
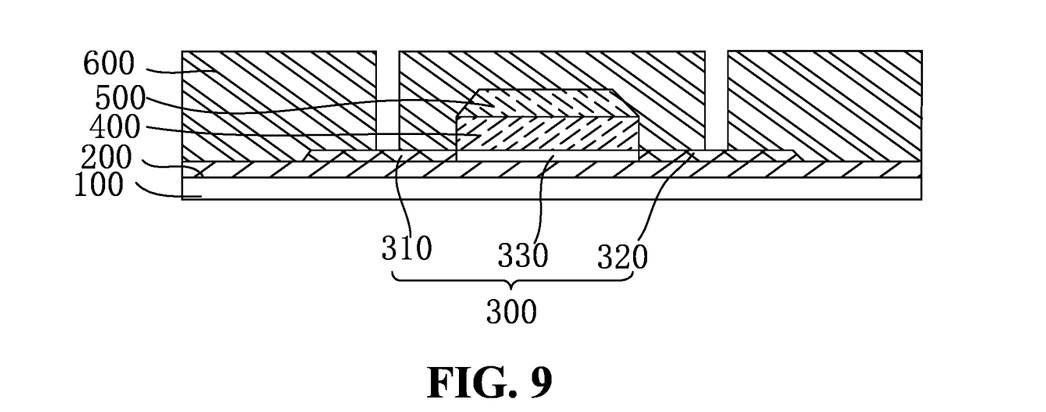

As shown in FIG. 9 and step S44, the dielectric layer 600 is deposited on the surface of the gate metal layer 500, the surfaces of the source region 310 and the drain region 320 of the semiconductor layer 300, and the surface of the buffer layer 200 through chemical vapor deposition. In one or more embodiments, the dielectric layer 600 is made of SiO2.

Figure 10:
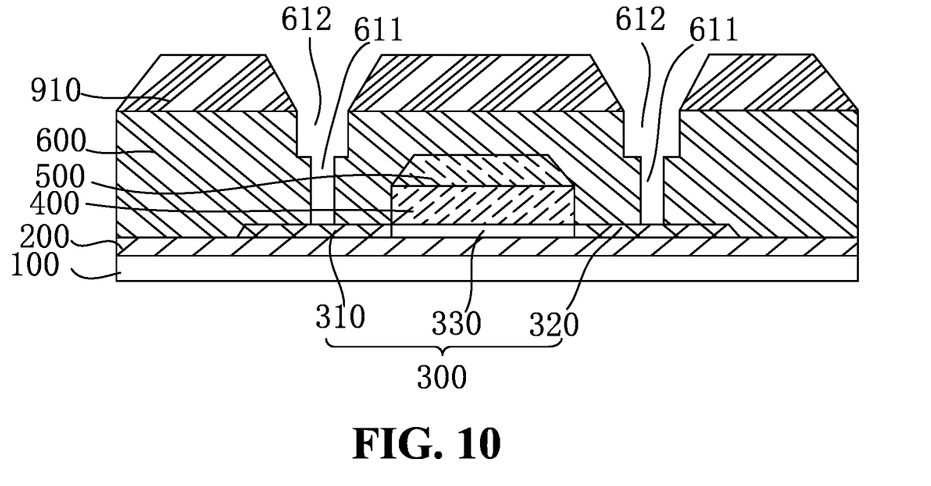

As shown in FIG. 10 and step S45, the dielectric layer 600 located in the source region 310 and the drain region 320 is etched through dry etching. Etching gas used for the etching includes carbon tetrafluoride. Two first via holes 611 and two second via holes 612 are formed, the two first via holes 611 are connected to the source region 310 and the drain region 320 respectively, the second via hole 612 is located on the top of the first via hole 611 and is in communication with the first via hole 611, and the aperture of the second via hole 612 is larger than the aperture of the first via hole 611. The dielectric layer 600 is etched to form the first via hole 611 and the second via hole 612 that are in communication with each other; the second via hole 612 is located on the top of the first via hole 611; and the aperture of the second via hole 612 is larger than the aperture of the first via hole 611. When metal wires are bonded, a buffer structure is formed, so that steepness of the via holes 610 is reduced, and the metal wires are not easy to break.

Figure 11:
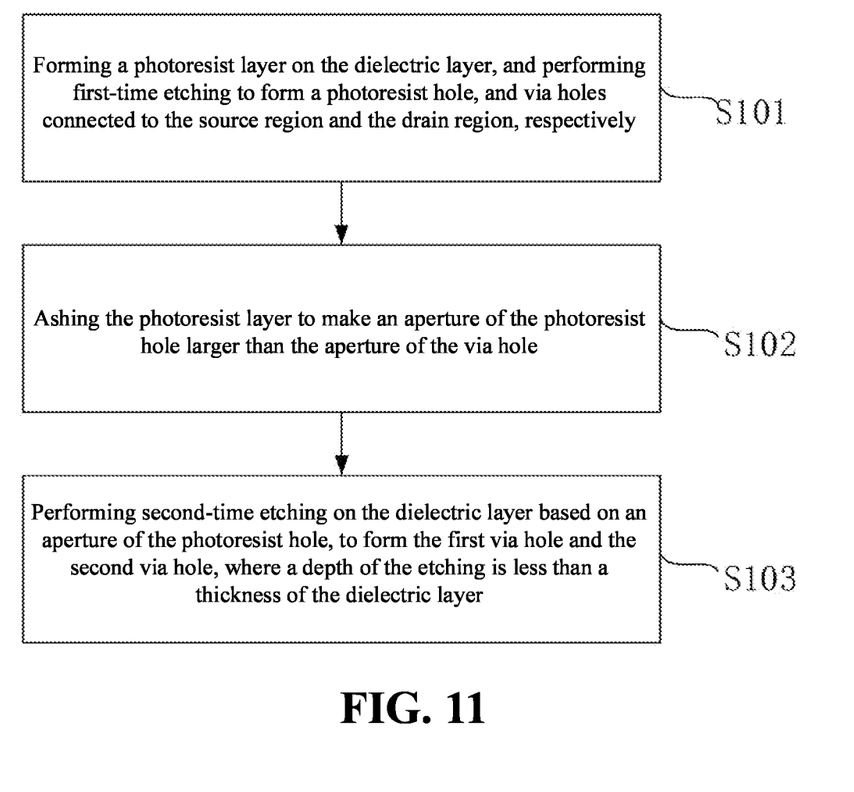
FIG. 11 is a schematic diagram of steps of a display panel manufacturing method according to one or more embodiments of the disclosure.

As shown in FIG. 11, forming via holes 610 respectively corresponding to the source 700 and the drain 800 on the dielectric layer 600 specifically includes the following steps:

S101: Form a photoresist layer 910 on the dielectric layer 600, and perform first-time etching to form a photoresist hole 911, and via holes 610 connected to the source region 310 and the drain region 320, respectively.

S102: Ash the photoresist layer 910 to make an aperture of the photoresist hole 911 larger than the aperture of the via hole 610.

S103: Perform second-time etching on the dielectric layer 600 based on the aperture of the photoresist hole 911, to form the first via hole 611 and the second via hole 612, where a depth of the etching is less than a thickness of the dielectric layer 600.

Figure 12:
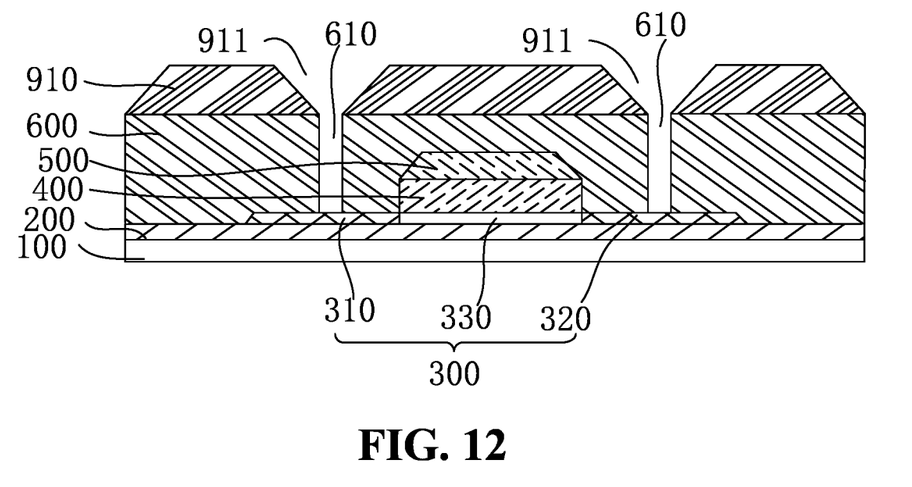
FIG. 12 to FIG. 14 are schematic flowcharts of a display panel manufacturing method according to one or more embodiments of the disclosure.

As shown in FIG. 12 and step S101, a photomask is used to perform a yellow light process, the photoresist layer 910 is coated on the dielectric layer 600, and the first-time etching is performed to form the photoresist hole 911, and the via holes 610 connected to the source region 310 and the drain region 320, respectively.

Figure 13:
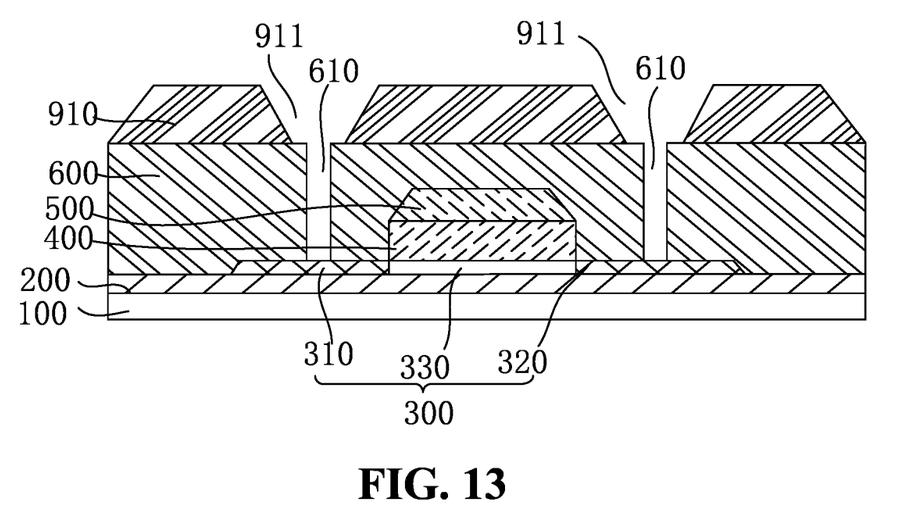

As shown in FIG. 13 and step S102, the photoresist layer 910 is asked to increase the aperture of the photoresist hole 911 to be larger than the aperture of the via hole 610, thereby exposing the dielectric layer 600 so that the photoresist hole 911 and the via hole 610 are coaxial, which is convenient for later etching.

Figure 14:
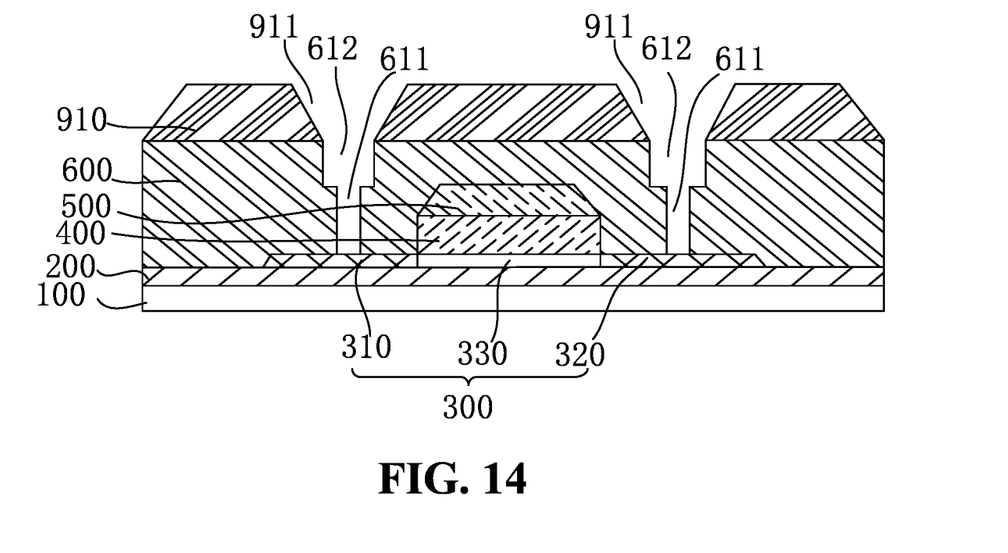

As shown in FIG. 14 and step S103, the second-time etching is performed on the dielectric layer 600 based on the aperture of the photoresist hole 911, to form the first via hole 611 and the second via hole 612, where the depth of the etching is less than the thickness of the dielectric layer 600, and the aperture of the second via hole 612 is larger than the aperture of the first via hole 611.

Figure 15:
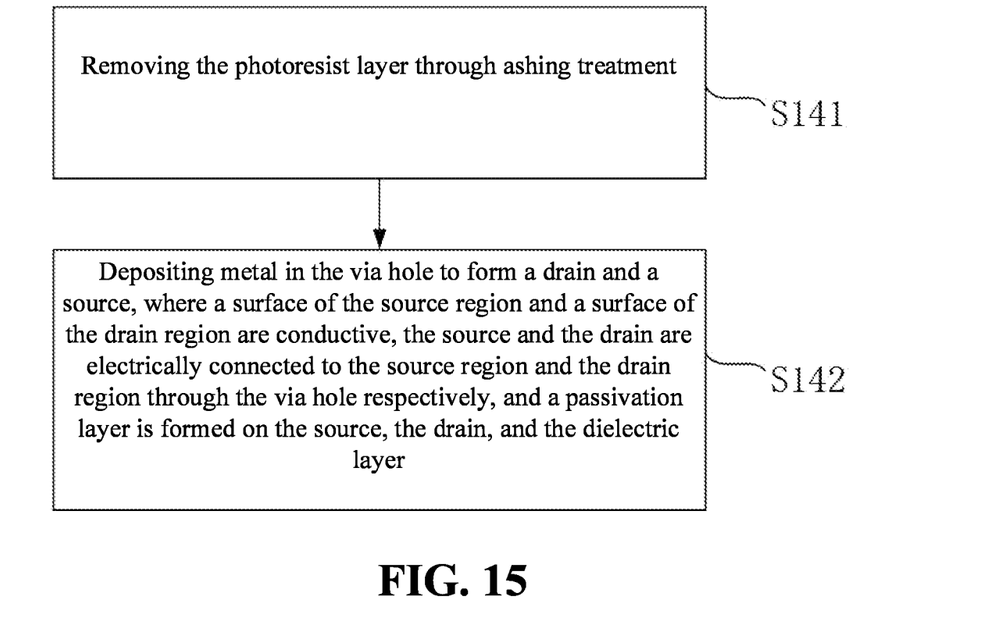
FIG. 15 is a schematic diagram of steps of a display panel manufacturing method according to one or more embodiments of the disclosure.

After the first via hole 611 and the second via hole 612 are formed, as shown in FIG. 15, the method for manufacturing a display panel 120 further includes the following steps:

S1411 Remove the photoresist layer 910 through aching treatment.

Figure 16:
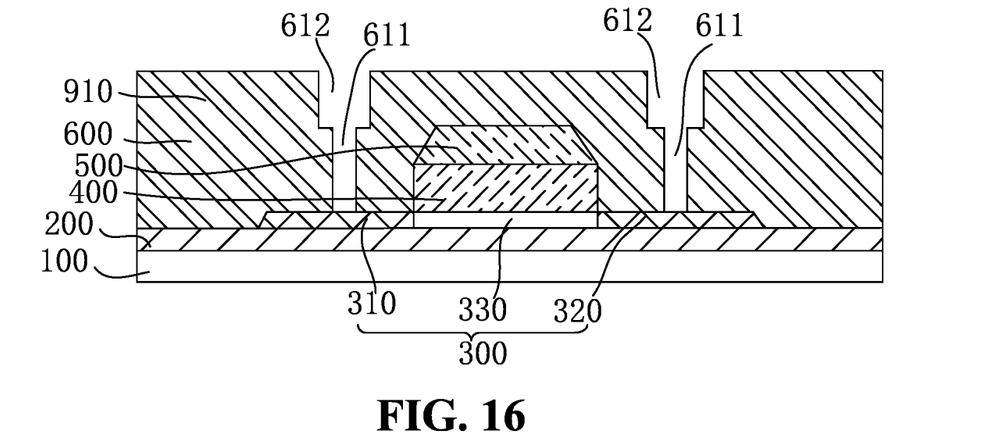
FIG. 16 and FIG. 17 are schematic flowcharts of a display panel manufacturing method according to one or more embodiments of the disclosure.

S142: Deposit metal in the via hole 610 to form the drain 800 and the source 700, where the surface of the source region 310 and the surface of the drain region 320 are conductive, the source 700 and the drain 800 are electrically connected to the source region 310 and the drain region 320 through the via hole 610 respectively, and the passivation layer 900 is formed on the source 700, the drain 800, and the dielectric layer 600. As shown in FIG. 16 and step S141, the corresponding photoresist layer 910 on the dielectric layer 600 is removed through an ashing process.

Figure 17:
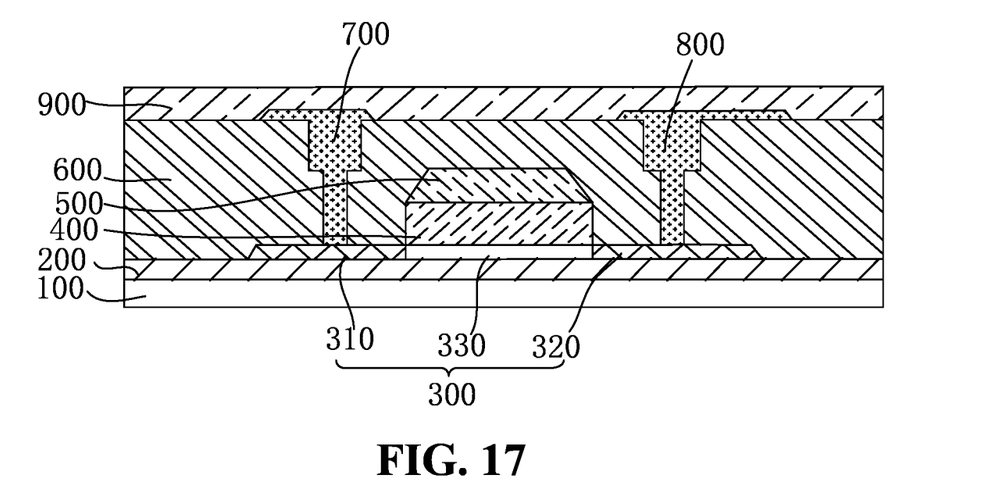

As shown in FIG. 17 and step S142, metal is deposited in the hole to form the source 700 electrically connected to the source region 310 and the drain 800 electrically connected to the drain region 320; a process is used to make the surface of the source region 310 and the surface of the drain region 320 conductive; the drain 800 and the source 700 are respectively connected to the drain region 320 and the source region 310 to achieve a conductive effect; the passivation layer 900 covers the source 700, the drain 800, and the dielectric layer 600 to protect the source 700 and the drain 800.

Figure 18:
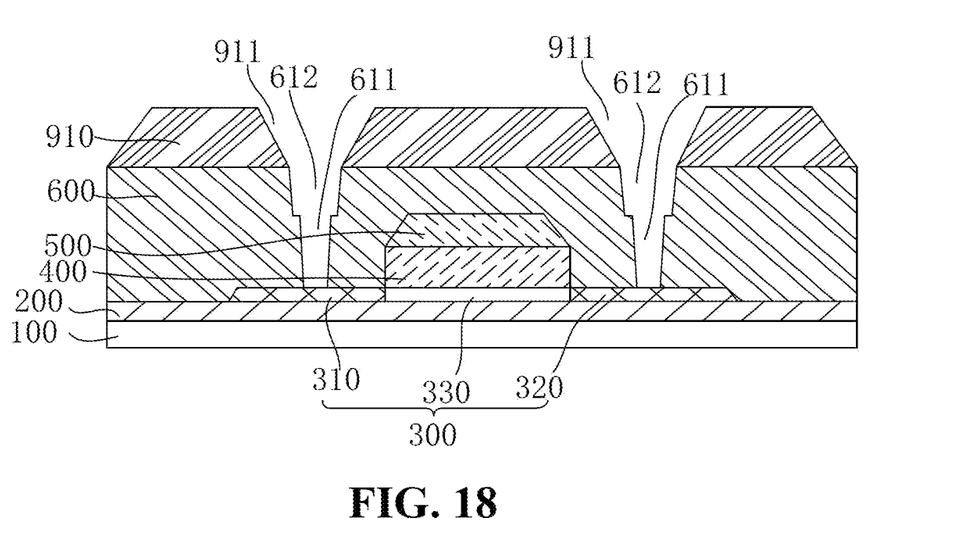
FIG. 18 is a schematic diagram of a display panel according to one or more embodiments of the disclosure.

As shown in FIG. 18, the first via hole 611 and the second via hole 612 are coaxial; the aperture of the first via hole 611 gradually increases from the source region 310 or the drain region 320 to the top of the first via hole 611; and the aperture of the second via hole 612 gradually increases from the top of the first via hole 611 to the top of the second via hole 612. The etched first via hole 611 and second via hole 612 are similar in shape to a cone, and their sidewalls are sloped, and their apertures gradually increase from bottom to top. When metal wires are deposited in the holes, steepness of the metal wires can be reduced, and a coverage thickness of the metal wires further increases, so that the metal wires are not easy to break and contact impedance is reduced.

Figure 19:
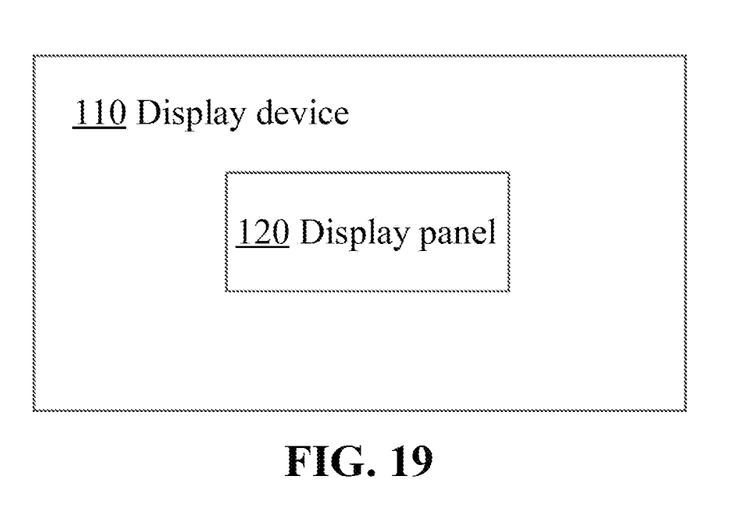
FIG. 19 is a schematic diagram of a display device according to one or more embodiments of the disclosure.

As shown in FIG. 19, in one or more embodiments of the disclosure, a display device 110 is disclosed, including any display panel 120 described above.

It should be noted that the restriction for each step included in this solution is not considered as a limitation on a sequence of the steps without affecting specific implementation of the solution. The steps described first may be performed first, may be performed later, or even may be performed simultaneously, provided that this solution can be implemented, which should be considered as falling within the protection scope of the disclosure.

The technical solutions of the present application can be widely used in various display panels, such as a twisted nematic (TN) display panel, an in-plane switching (IPS) display panel, a vertical alignment (VA) display panel, and a multi-domain vertical alignment (MVA) display panel, or may certainly be used in other types of display panels, such as an organic light-emitting diode (OLED) display panel. The foregoing solutions are applicable to all these display panels. The foregoing content further describes the disclosure in detail with reference to one or more specific optional embodiments, and this specification should not be construed as a limitation on one or more specific embodiments of the disclosure. A person of ordinary skill in the art to which the disclosure pertains may make some simple derivations or replacements without departing from the idea of the disclosure, and the derivations or replacements should all fall within the protection scope of the disclosure.

What is claimed is:
1. A display panel, comprising:
   a substrate;
   a buffer layer, formed on the substrate;
   a semiconductor layer, formed on the buffer layer, wherein the semiconductor layer comprises a source region, a drain region, and a channel region, and the channel region is arranged between the source region and the drain region;
   a gate insulating layer, formed at a position corresponding to the channel region of the semiconductor layer;
   a gate metal layer, formed on the gate insulating layer; and
   a dielectric layer, which is a single layer, wherein the dielectric layer covers the buffer layer, the semiconductor layer, and the gate metal layer, wherein the dielectric layer correspondingly covering the source region and the drain region defines via holes separately, the via holes each comprise a first via hole and a second via hole, the first via hole is connected to the source region or the drain region, the second via hole is located on the top of the first via hole and is in communication with the first via hole, and an aperture of the second via hole is larger than an aperture of the first via hole;
   wherein a step is formed at a junction of the first via hole and the second via hole;
   wherein the first via hole and the second via hole are coaxial; wherein both the first via hole and the second via hole are cylindrical holes.

2. The display panel according to claim 1, wherein a depth of the first via hole and a depth of the second via hole are identical.

3. The display panel according to claim 1, wherein a depth of the first via hole is less than a depth of the second via hole.

4. The display panel according to claim 1, wherein the display panel further comprises a source, a drain, and a passivation layer; the source and the drain are respectively connected to the source region and the drain region through the via hole; and the passivation layer covers the source, the drain, and the dielectric layer.

5. A display device, comprising a display panel, wherein the display panel comprises:
- a substrate;
- a buffer layer, formed on the substrate;
- a semiconductor layer, formed on the buffer layer, wherein the semiconductor layer comprises a source region, a drain region, and a channel region, and the channel region is arranged between the source region and the drain region;
- a gate insulating layer, formed at a position corresponding to the channel region of the semiconductor layer;
- a gate metal layer, formed on the gate insulating layer; and
- a dielectric layer, which is a single layer, wherein the dielectric layer covers the buffer layer, the semiconductor layer, and the gate metal layer, wherein the dielectric layer correspondingly covering the source region and the drain region defines via holes separately, the via holes each comprise a first via hole and a second via hole, the first via hole is connected to the source region or the drain region, the second via hole is located on the top of the first via hole and is in communication with the first via hole, and an aperture of the second via hole is larger than an aperture of the first via hole; wherein a step is formed at a junction of the first via hole and the second via hole;

wherein the first via hole and the second via hole are coaxial; wherein both the first via hole and the second via hole are cylindrical holes.

6. The display device according to claim 5, wherein the semiconductor layer is formed by deposition of at least one of a zinc oxide based semiconductor material, an indium oxide based semiconductor material, a tin oxide based semiconductor material, and another semiconductor material.

7. The display device according to claim 5, wherein the dielectric layer is made of silicon dioxide.

8. A display panel, comprising:
- a substrate;
- a buffer layer, formed on the substrate;
- a semiconductor layer, formed on the buffer layer, wherein the semiconductor layer comprises a source region, a drain region, and a channel region, and the channel region is arranged between the source region and the drain region;
- a gate insulating layer, formed at a position corresponding to the channel region of the semiconductor layer;
- a gate metal layer, formed on the gate insulating layer; and
- a dielectric layer, which is a single layer, wherein the dielectric layer covers the buffer layer, the semiconductor layer, and the gate metal layer, wherein the dielectric layer correspondingly covering the source region and the drain region defines via holes separately, the via holes each comprise a first via hole and a second via hole, the first via hole is connected to the source region or the drain region, the second via hole is located on the top of the first via hole and is in communication with the first via hole, and an aperture of the second via hole is larger than an aperture of the first via hole; wherein a step is formed at a junction of the first via hole and the second via hole;

wherein the aperture of the first via hole gradually increases from the respective source region or drain region to the top of the first via hole; and the aperture of the second via hole gradually increases from the top of the first via hole to the top of the second via hole.

* * * * *